(12) United States Patent
Loeb et al.

(10) Patent No.: US 8,766,723 B1
(45) Date of Patent: Jul. 1, 2014

(54) METHODS AND DEVICES FOR FOLDED PUSH PULL POWER AMPLIFIERS

(75) Inventors: Wayne A. Loeb, San Francisco, CA (US); David M. Signoff, Mountain View, CA (US)

(73) Assignee: Marvell International Ltd. (BM)

( * ) Notice: Subject to any disclaimer, the term of this patent is extended or adjusted under 35 U.S.C. 154(b) by 84 days.

(21) Appl. No.: 13/439,130

(22) Filed: Apr. 4, 2012

Related U.S. Application Data

(60) Provisional application No. 61/472,577, filed on Apr. 6, 2011.

(51) Int. Cl.
*H03F 3/26* (2006.01)
(52) U.S. Cl.
USPC .......................................................... 330/276
(58) Field of Classification Search
USPC .................... 330/165, 188, 195, 264, 276
See application file for complete search history.

(56) References Cited

U.S. PATENT DOCUMENTS

| | | | | |
|---|---|---|---|---|
| 3,714,597 A | * | 1/1973 | Reynolds | 330/275 |
| 5,742,205 A | * | 4/1998 | Cowen et al. | 330/269 |

* cited by examiner

*Primary Examiner* — Steven J Mottola

(57) ABSTRACT

Methods and devices provide for power amplification in a push pull power amplifier. A circuit comprises an input stage, a power amplifier stage and an output stage. The input stage provides a plurality of control voltages based on a control current. The input stage may include a transformer with a primary side and two secondary sides. A power amplifier stage comprises an NMOS transistor and a PMOS transistor arranged in a push-pull configuration to generate a plurality of amplified signals. The transistors may be in a common gate arrangement. The output stage combines the amplified signals and generates an output voltage. The output stage may include a transformer with two primary sides and a secondary side.

12 Claims, 4 Drawing Sheets

METHODS AND DEVICES FOR FOLDED PUSH PULL POWER AMPLIFIERS

CROSS REFERENCE TO RELATED APPLICATIONS

This application claims the benefit of U.S. Provisional App. No. 61/472,577 for "Folded Push Pull PA" filed Apr. 6, 2011, the disclosure of which is incorporated herein by reference.

BACKGROUND

Particular embodiments generally relate to power amplifiers.

Unless otherwise indicated herein, the approaches described in this section are not prior art to the claims in this application and are not admitted to be prior art by inclusion in this section.

A power amplifier may include a common source amplifier, a common gate amplifier or a stacked common gate with a common source amplifier. The power amplifier may be single ended or differential. In a common gate amplifier, the loading of the previous stage on the amplifier is strongly dependent on the size of the voltage swing of the signal at the input of the amplifier. This nonlinearity is also asymmetric for the top of the voltage swing in comparison to the bottom of the voltage swing.

SUMMARY

Embodiments include circuits and methods for folded push pull power amplifiers. A circuit comprises an input stage, a power amplifier stage and an output stage. The input stage is configured to provide a plurality of control voltages based on a control current. The power amplifier stage comprises a first transistor and a second transistor. The first transistor is a first type. The second transistor is a second type. The first and second transistors are arranged in a push-pull configuration to generate a plurality of amplified signals. The output stage is configured to combine the amplified signals and generates an output voltage.

In some embodiments, a driver stage provides the control current to the input stage.

In some embodiments, the driver stage includes a transconductance circuit.

In some embodiments, the input stage comprises a transformer that includes a primary side that is coupled to receive the control current, a first secondary side that is configured to generate a first control voltage based on the control current, and a second secondary side that is configured to generate a second control voltage based on the control current.

In some embodiments, the output stage comprises a transformer that includes a first primary side that is coupled to receive a first one of the amplified signals, a second primary side that is coupled to receive a second one of the amplified signals, and a secondary side that is configured to generate the output voltage based on the first one of the amplified signals and the second one of the amplified signals.

In some embodiments, the first transistor is an NMOS transistor arranged in a common gate configuration, and the second transistor is a PMOS transistor arranged in a common gate configuration.

In some embodiments, the input stage comprises a first transformer that includes a primary side that is coupled to receive the control current that is a differential control current, a first secondary side that is configured to generate a first differential control voltage based on the differential control current, and a second secondary side that is configured to generate a second differential control voltage based on the differential control current. The output stage comprises a second transformer that includes a first primary side coupled to receive a first pair of the amplified signals, a second primary side that is coupled to receive a second pair of the amplified signals, and a secondary side that is configured to generate a differential output voltage based on the first pair of amplified signals and the second pair of amplified signals. The power amplifier stage further comprises a third transistor and a fourth transistor. The third transistor is of the first type. The fourth transistor is of the second type. The first and third transistors are coupled as a differential pair between the first secondary side of the first transformer and the first primary side of the second transformer to generate the first pair of amplified signals. The second and fourth transistors are coupled as a differential pair between the second secondary side of the first transformer and the second primary side of the second transformer to generate the second pair of amplified signals.

In some embodiments, the first transistor and the third transistor are NMOS transistor arranged in a common gate configuration, and the second transistor and the fourth transistor are PMOS transistors arranged in a common gate configuration.

In some embodiments, a circuit comprises a first amplifier circuit and a second amplifier circuit. The first amplifier circuit comprises a first input stage, a first power amplifier stage and a first output stage. The first input stage is configured to provide a plurality of first control voltages based on a control current. The first power amplifier stage comprises a first transistor and a second transistor. The first transistor is a first type. The second transistor is a second type. The first and second transistors are arranged in a push-pull relationship to generate a plurality of first amplified signals. The first output stage is configured to combine the first amplified signals and generate a first output voltage.

In second amplifier circuit comprises a second input stage, a second power amplifier stage and a second output stage. The second input stage is configured to provide a plurality of second control voltages based on the first output voltage. The second power amplifier stage comprises a third transistor and a second transistor. The third transistor is a first type. The fourth transistor is a second type. The third and fourth transistors are arranged in a push-pull configuration to generate a plurality of second amplified signals. The second output stage is configured to combine the second amplified signals and generate a second output voltage.

In some embodiments, a method comprises generating a plurality of control voltages based on a control current. The control voltages are applied in a power amplifier stage that comprises a first transistor and a second transistor. The first transistor is a first type. The second transistor is a second type. The first and second transistors are arranged in a push-pull configuration. An output voltage is outputted based on a combination of the amplified control voltages.

In some embodiments, the control current is provided.

In some embodiments, the control current is generated using a transconductance circuit.

In some embodiments, generating the plurality of control voltage comprises receiving the control current on a primary side of a transformer; generating a first control voltage on a first secondary side of the transformer based on the control current; and generating a second control voltage on a second secondary side of the transformer based on the control current.

In some embodiments, outputting an output voltage based on a combination of the amplified control voltages comprises receiving a first amplified signal at a first primary side of a transformer; receiving a second amplified signal at a second primary side of the transformer; and generating the output voltage at a secondary side of the transformer based on the first amplified signal and the second amplified signals.

In some embodiments, the first transistor is an NMOS transistor arranged in a common gate configuration, and the second transistor is a PMOS transistor arranged in a common gate configuration.

In some embodiments, generating the plurality of control voltages comprises receiving the control current on a primary side of a first transformer; generating a first differential control voltage on a first secondary side of the first transformer; and generating a second differential control voltage on a second secondary side of the first transformer. Outputting an output voltage based on a combination of the amplified control voltages comprises receiving a first pair of amplified signals at a first primary side of a second transformer; receiving a second pair of amplified signals at a second primary side of the second transformer; and generating the output voltage at a secondary side of the second transformer based on a first pair of differential amplified signals and a second pair of differential amplified signals. Amplifying the control voltages in a power amplifier stage comprises generating the first pair of differential amplified signals and the second pair of differential amplified signals in the power amplifier stage. The power amplifier stage further comprises a third transistor and a fourth transistor. The third transistor is of the first type. The fourth transistor is of the second type. The first and third transistors are coupled as a differential pair between the first secondary side of the first transformer and the first primary side of the second transformer to generate the first pair of amplified signals. The second and fourth transistors are coupled as a differential pair between the second secondary side of the first transformer and the second primary side of the second transformer to generate the second pair of amplified signals.

In some embodiments, the first transistor and the third transistor are NMOS transistors arranged in a common gate configuration, and the second transistor and the fourth transistor are PMOS transistors arranged in a common gate configuration.

The following detailed description and accompanying drawings provide a better understanding of the nature and advantages of the embodiments described herein.

DETAILED DESCRIPTION

Described herein are techniques for methods and devices for push pull power amplifiers. In the following description, for purposes of explanation, numerous examples and specific details are set forth in order to provide a thorough understanding of the disclosure. It will be evident, however, to one skilled in the art that the present invention as defined by the claims may include some or all of the features in these examples alone or in combination with other features described below, and may further include modifications and equivalents of the features and concepts described herein.

Figure 1:
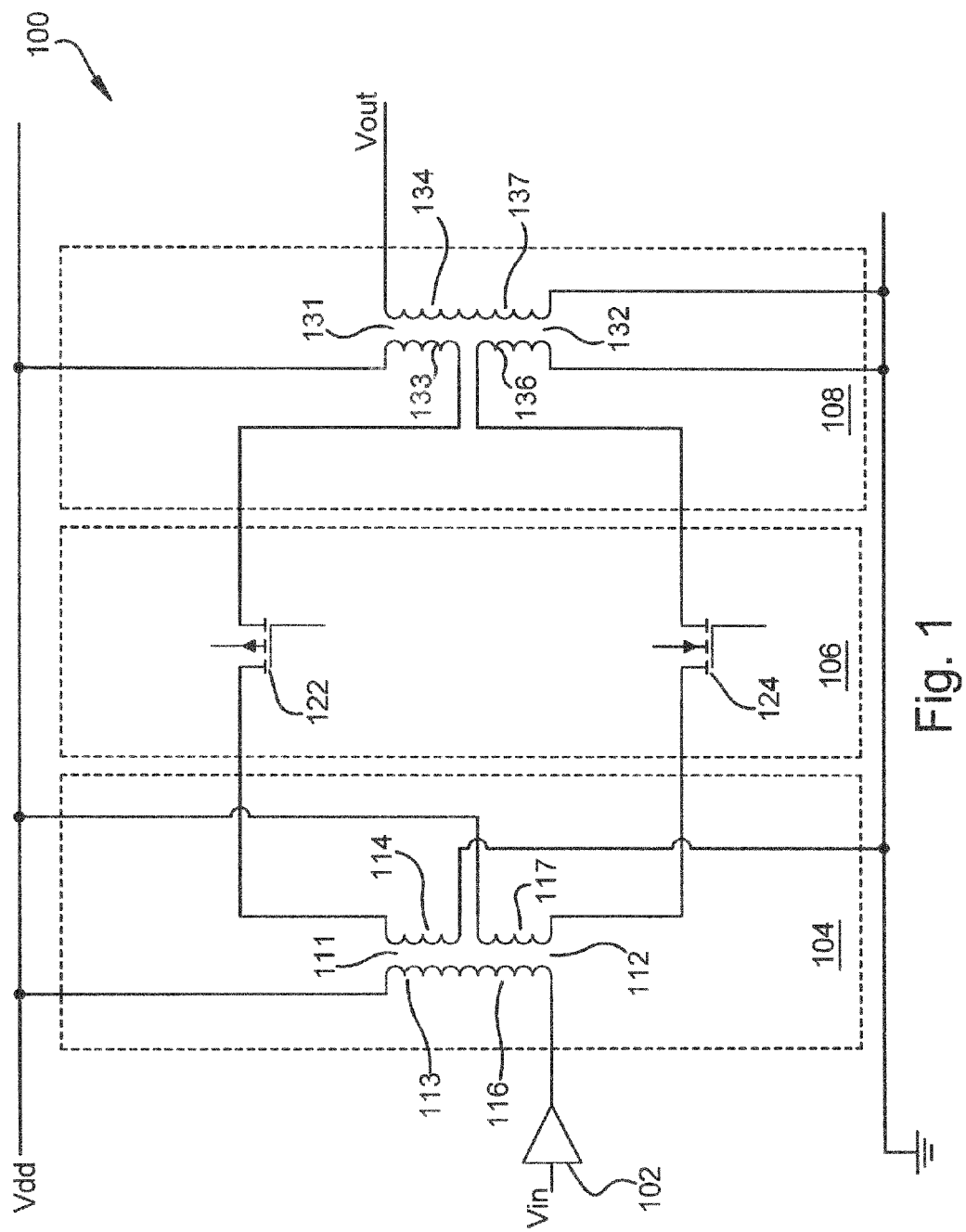
FIG. 1 illustrates a push pull power amplifier according to one embodiment.

FIG. 1 illustrates a push pull power amplifier 100 according to one embodiment. Power amplifier 100 comprises a driver circuit 102, an input stage 104, a power amplifier stage 106, and an output stage 108. Driver circuit 102 provides a control current to input stage 104 based on an input voltage Vin. Input stage 104 splits the control current to provide control voltages to different inputs of power amplifier stage 106. Power amplifier stage 106 amplifies the voltages and provides the amplified voltages to output stage 108. Output stage 108 combines the amplified voltages and provides an output voltage Vout at an output node.

In one embodiment, driver circuit 102 is a transconductance circuit. Driver circuit 102 may be, for example, a common source amplifier, a folded cascode amplifier, or a stacked common gate plus common source amplifier. Driver circuit 102 may be single ended or differential.

Input stage 104 splits the power from driver circuit 102 and provides the split power as a pair of control voltages to two inputs of power amplifier stage 106. Input stage 104 adjusts the load impedance of driver circuit 102 on the input of power amplifier stage 106. Input stage 104 trades off voltage gain and current gain. In some embodiments, input stage 104 comprises a first input transformer 111 and a second input transformer 112. First input transformer 111 and second input transformer 112 inductively couple driver circuit 102 to power amplifier stage 106. First input transformer 111 includes a primary side 113 and a secondary side 114. Second input transformer 112 includes a primary side 116 and a secondary side 117. Primary side 113 and primary side 116 are coupled between a supply voltage Vdd and the output of driver circuit 102. Although first input transformer 111 and second input transformer 112 are shown as separate transformers with separate windings, first input transformer 111 and second input transformer 112 may be formed as a single transformer with one primary side and two secondary sides (e.g., secondary side 114 and secondary side 117). The characteristics of first input transformer 111 and second input transformer 112 are selected based on the size of the linear swing of driver circuit 102 and the maximum swing desired at the inputs of power amplifier stage 106. Input stage 104 operates as a power splitter that splits the power from driver circuit 102 between first input transformer 111 and second input transformer 112 and provides the power to two inputs of power amplifier stage 106.

Power amplifier stage 106 comprises an n-channel metal-oxide-semiconductor field-effect transistor (NMOS) transistor 122 and a p-channel metal-oxide-semiconductor field-effect transistor (PMOS) transistor 124. NMOS transistor 122 and PMOS transistor 124 are arranged in a push pull amplifier configuration. The source and drain of NMOS transistor 122 are coupled to input stage 104 and output stage 108, respectively. Secondary side 114 couples NMOS transistor 122 to ground. In one embodiment, NMOS transistor 122 is arranged in a common gate configuration.

The source and drain of PMOS transistor 124 are coupled to input stage 104 and output stage 108, respectively. Secondary side 117 couples PMOS transistor 124 to the supply voltage Vdd. In one embodiment, PMOS transistor 124 is arranged in a common gate configuration. Although power stage amplifier 106 is described for NMOS and PMOS transistors, other types of transistors (e.g., bipolar junction transistor or heterojunction bipolar transistor) may be used. For example, an npn bipolar junction transistor and a pnp bipolar junction transistor may be arranged in a push pull configuration with the transistors in a common emitter configuration.

Output stage 108 operates as a power combiner that combines the power of the NMOS transistor 122 and PMOS transistor 124. Output stage 108 transforms the output impedance (e.g., antenna impedance) to an impedance that provides the desired power given the voltage swing at the output of power amplifier stage 106 (e.g., the drain of NMOS transistor 122 and PMOS transistor 124). In some embodiments, output stage 108 comprises a first output transformer 131 and a second output transformer 132. First output transformer 131 and second output transformer 132 inductively couple power amplifier stage 106 to output stage 108.

NMOS transistor 122 and PMOS transistor 124 are coupled in parallel through transformer 111 and transformer 112 of input stage 104 and through transformer 131 and transformer 132 of output stage 108.

First output transformer 131 includes a primary side 133 and a secondary side 134. Second output transformer 132 includes a primary side 136 and a secondary side secondary side 137. Although first output transformer 131 and second output transformer 132 are shown as separate transformers with separate windings, first output transformer 131 and second output transformer 132 may be formed as a single transformer with two primary sides (primary side 133 and primary side 136) and one secondary side (e.g., a single secondary side instead of secondary side 134 and secondary side 137). The characteristics of first output transformer 131 and second output transformer 132 are selected based on the size of the swing at the outputs of power amplifier stage 106 and the maximum swing desired at the output of output stage 108.

First input transformer 111 and second input transformer 112 may be formed of three magnetically coupled inductors or some other RF matching network that achieves the same impedance transformation, power splitting and power combining. First output transformer 131 and second output transformer 132 may be formed of three magnetically coupled inductors or some other RF matching network that achieves the same impedance transformation, power splitting and power combining.

Particular embodiments provide many advantages. For example, a common gate amplifier configuration of input stage 104 may use more of the supply voltage range than a stacked common source plus common gate amplifier. The push pull power amplifier formed of NMOS and PMOS transistors (e.g., NMOS transistor 122 and PMOS transistor 124) improves the control of the loading of driver circuit 102. As the input impedance of NMOS transistor 122 increases, the input impedance of PMOS transistor 124 decreases to limit the variation in loading of driver circuit 102. The push pull power amplifier may have double the voltage swing on the drains of the NMOS and PMOS transistors for a given supply voltage relative to a stack transistor configuration that will have a swing of one half the given supply voltage. Coupling NMOS transistor 122 and PMOS transistor 124 in parallel may reduce the asymmetry of the signal swing, because one of the transistors is at the top of its voltage swing while the other is at the bottom of its voltage swing.

Figure 2:
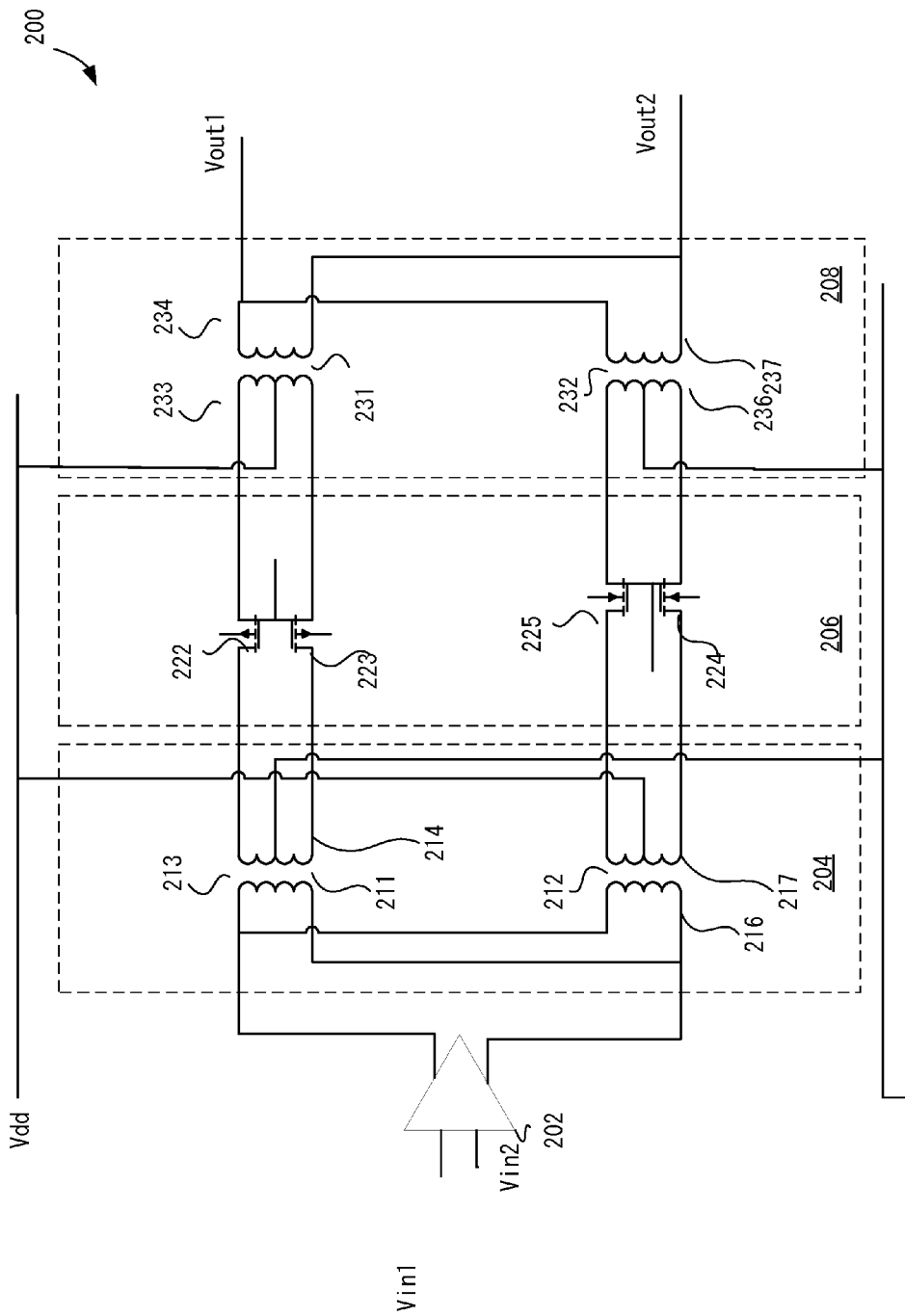
FIG. 2 illustrates a differential push pull power amplifier according to one embodiment.

FIG. 2 illustrates a differential push pull power amplifier 200 according to one embodiment. Power amplifier 200 comprises a driver circuit 202, an input stage 204, a power amplifier stage 206, and an output stage 208. Driver circuit 202 provides a differential control current to input stage 204 based on a differential voltage of an input voltage Vin1 and an input voltage Vin2. Input stage 204 splits the control current to provide control voltages to different inputs of power amplifier stage 206. Power amplifier stage 206 amplifies the voltages and provides the amplified voltages to output stage 208. Output stage 208 combines the amplified voltages and provides a differential voltage of an output voltage Vout1 and an output voltage Vout2 at differential output nodes.

Driver circuit 202 may be, for example, a differential common source amplifier, a folded cascode differential amplifier, or a stacked differential common gate plus common source amplifier.

Input stage 204 splits the power from driver circuit 202 and provides the split power as a pair of differential control voltages to two differential input pairs of power amplifier stage 206. The input of power amplifier stage 206 loads the output of input stage 204. Input stage 204 loads the output of driver circuit 202 and adjusts the load on the input of power amplifier stage 206. Input stage 204 trades off voltage gain and current gain. In some embodiments, input stage 204 comprises a first input transformer 211 and a second input transformer 212. First input transformer 211 and second input transformer 212 inductively couple driver circuit 202 to power amplifier stage 206. Driver circuit 202 provides the differential control current across first input transformer 211 and second input transformer 212. First input transformer 211 includes a primary side 213 and a secondary side 214. Secondary side 214 is centered tapped to ground. Second input transformer 212 includes a primary side 216 and a secondary side 217. Secondary side 214 is centered tapped to supply voltage Vdd. Although first input transformer 211 and second input transformer 212 are shown as separate transformers with separate windings, first input transformer 211 and second input transformer 212 may be formed as a single transformer with one primary side and two secondary sides (e.g., secondary side 214 and secondary side 217). Although secondary side 214 and secondary side 217 are shown as center tapped transformers, either secondary side 214 or secondary side 217 or both may be formed of two transformers. The characteristics of first input transformer 211 and second input transformer 212 may be selected in a similar manner as input transformers 111 and 112 described above. Input stage 204 operates as a power splitter that splits the power from driver circuit 202 between first input transformer 211 and second input transformer 212 and provides the power to two differential pair inputs of power amplifier stage 206.

Power amplifier stage 206 comprises an NMOS transistor 222, an NMOS transistor 223, a PMOS transistor 224 and a PMOS transistor 225. NMOS transistor 222 and NMOS transistor 223 are arranged as a differential pair. The differential pair of NMOS transistors 222 and 223 and the differential pair of PMOS transistors 224 and 225 are arranged in a push pull amplifier configuration. PMOS transistor 224 and PMOS transistor 225 are arranged as a differential pair. The source and drain of NMOS transistor 222 are coupled to input stage 204 and output stage 208, respectively. The source and drain of NMOS transistor 223 are coupled to input stage 204 and output stage 208, respectively.

The source and drain of PMOS transistor 224 are coupled to input stage 204 and output stage 208, respectively. The source and drain of PMOS transistor 225 are coupled to input stage 204 and output stage 208, respectively. In one embodiment, NMOS transistor 222 and NMOS transistor are arranged in a differential common gate configuration. In one embodiment, PMOS transistor 224 and PMOS transistor 225 are arranged in a differential common gate configuration. Although power stage amplifier 206 is described for NMOS and PMOS transistors, other types of transistors (e.g., bipolar junction transistor or heterojunction bipolar transistor) may be used. For example, a differential pair of npn bipolar junction transistors and a differential pair of pnp bipolar junction transistors may be arranged in a push pull configuration with the transistors in a common emitter configuration.

Output stage 208 operates as a power combiner that combines the power of the differential pair of NMOS transistor 222 and NMOS transistor 223 and the differential pair of PMOS transistor 224 and PMOS transistor 225. Output stage 208 transforms the output impedance (e.g., antenna impedance) to an impedance that provides the desired power given the voltage swing at the output of power amplifier stage 206 (e.g., the drain of NMOS transistors 222 and 223 and PMOS transistors 224 and 225). In some embodiments, output stage 208 comprises a first output transformer 231 and a second output transformer 232. First output transformer 231 and second output transformer 232 inductively couple power amplifier stage 206 to output stage 208.

The differential pair of NMOS transistors 222 and 223 and the differential pair of PMOS transistors 224 and 225 are coupled in parallel through transformers 211 and 212 of input stage 204 and through transformers 231 and 232 of output stage 208.

First output transformer 231 includes a primary side 233 and a secondary side 234. Primary side 233 is centered tapped to supply voltage Vdd. Second output transformer 232 includes a primary side 236 and a secondary side secondary side 237. Primary side 236 is centered tapped to ground. Although first output transformer 231 and second output transformer 232 are shown as separate transformers with separate windings, first output transformer 231 and second output transformer 232 may be formed as a single transformer with two primary sides (primary side 233 and primary side 236) and one secondary side (e.g., a single secondary side instead of secondary side 234 and secondary side 237). Although primary side 233 and primary side 236 are shown as center tapped transformers, either primary side 233 or primary side 236 or both may be formed of two transformers. The characteristics of first output transformer 231 and second output transformer 232 may be selected in a similar manner as output transformers 131 and 132 described above.

First input transformer 211 and second input transformer 212 may be formed of three magnetically coupled inductors or some other RF matching network that achieves the same impedance transformation, power splitting and power combining. First output transformer 231 and second output transformer 232 may be formed of three magnetically coupled inductors or some other RF matching network that achieves the same impedance transformation, power splitting and power combining.

Figure 3:
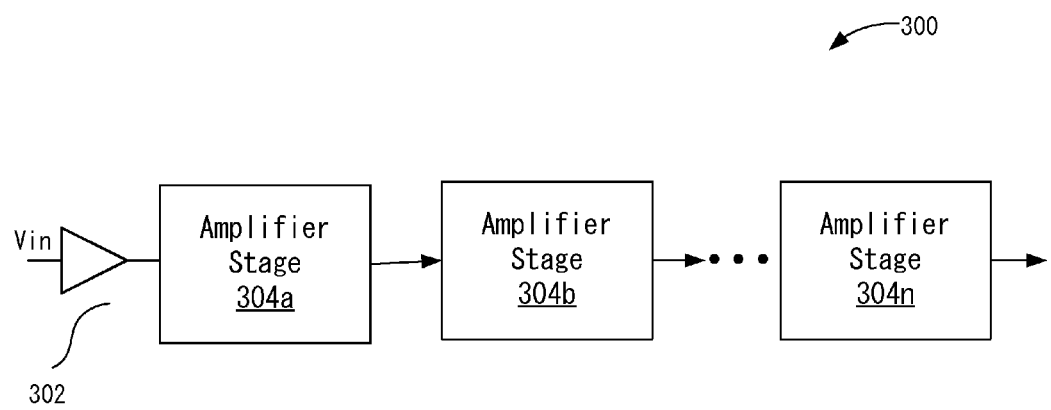
FIG. 3 illustrates a multiple stage push pull power amplifier according to one embodiment.

FIG. 3 illustrates a multiple stage push pull power amplifier 300 according to one embodiment. Power amplifier 300 comprises a driver circuit 302 and a plurality of cascaded amplifier stages 304a, 304b through 304n. In one embodiment, driver circuit 302 is driver circuit 102 and amplifier stage 304 includes input stage 104, power amplifier stage 106, and output stage 108. In one embodiment, driver circuit 302 is driver circuit 202 and amplifier stage 304 includes input stage 204, power amplifier stage 206, and output stage 208. The number n of stages may be selected based on power gain, output loading, noise sensitivity, and reverse isolation.

Particular embodiments provide many advantages. For example, multiple amplifier stages 404 may provide more power gain, better reverse isolation, and improved noise response.

Figure 4:
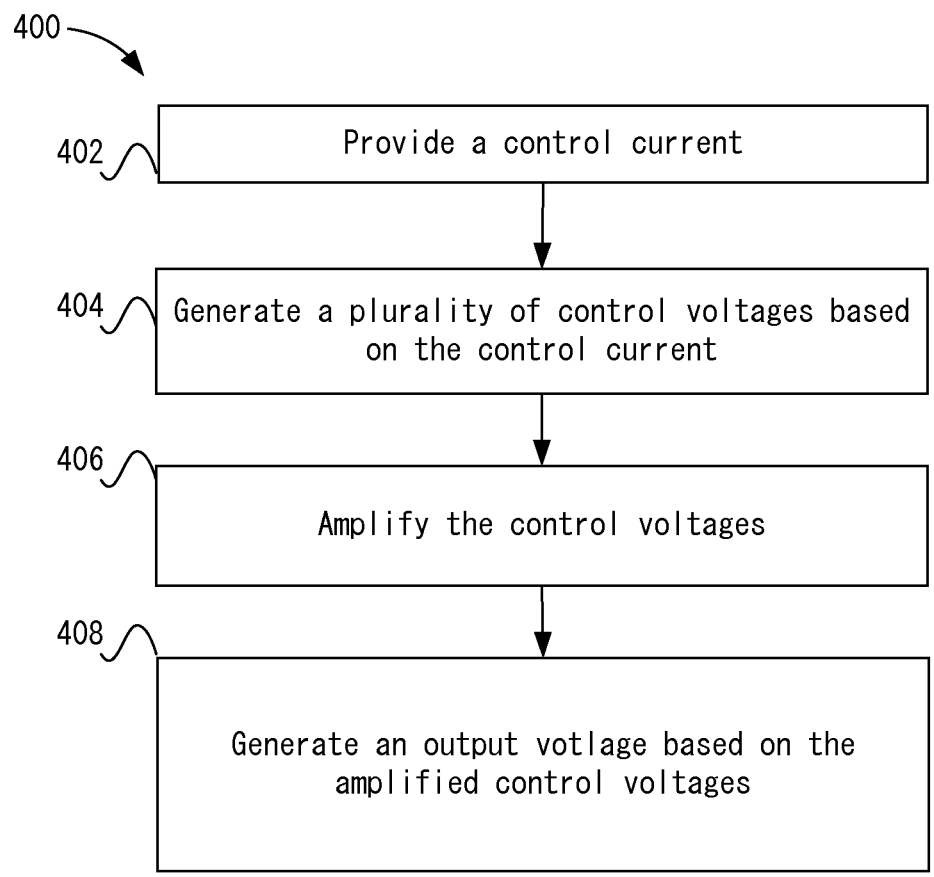
FIG. 4 illustrates a simplified flowchart of a method for power amplification according to one embodiment.

FIG. 4 illustrates a simplified flowchart 400 of a method for power amplification according to one embodiment. At 402, a control current is provided by driver stage 102. At 404, a plurality of control voltages are generated by input stage 104 based on a control current. In one embodiment, the control current is received by primary sides 113 and 116. Secondary side 114 generates a first control voltage. Secondary side 117 generates a second control voltage. At 406, the control voltages are amplified in power amplifier stage 106. At 408, an output voltage is outputted based on a combination of amplified control voltages. In one embodiment, a first amplified signal is received at primary side 133. A second amplified signal is received at primary side 136. Secondary sides 134 and 137 generate the output voltage based on the first amplified signal and the second amplified signals.

Although flowchart 400 is described for power amplifier 100, the method for power amplification may be used in a similar manner for power amplifier 200.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A method comprising:
generating a plurality of control voltages using an input transformer with a single primary side and two secondary sides, wherein the single primary side receives a control current and the two secondary sides provide the plurality of control voltages;
amplifying the control voltages using a power amplifier stage that comprises a first transistor and a second transistor arranged in parallel, wherein the first transistor is a metal-oxide-semiconductor field-effect transistor (MOSFET) of a first type and the second transistor is a MOSFET of a second type that is different from the first type, wherein the first transistor and the second transistor are arranged in a push-pull configuration; and
outputting an output voltage as a function of the amplified control voltages using an output transformer that comprises two primary sides and a single secondary side, wherein the two primary sides receive the amplified control voltages and the single secondary side provides the output voltage as a function of the amplified control voltages.

2. The method of claim 1, further comprising providing the control current to the input transformer using a driver stage.

3. The method of claim 2, further comprising generating the control current using a transconductance circuit.

4. The method of claim 1, wherein the first transistor is an n-channel MOSFET (NMOSFET) transistor arranged in a common gate configuration and the second transistor is a p-channel MOSFET (PMOSFET) transistor arranged in a common gate configuration.

5. The method of claim 1,
wherein generating the plurality of control voltages comprises:

receiving the control current on a primary side of a first transformer;

generating a first differential control voltage on a first secondary side of the first transformer; and generating a second differential control voltage on a second secondary side of the first transformer;

wherein outputting an output voltage based on a combination of the amplified control voltages comprises:

receiving a first pair of amplified signals at a first primary side of a second transformer;

receiving a second pair of amplified signals at a second primary side of the second transformer; and generating the output voltage at a secondary side of the second transformer based on a first pair of differential amplified signals and a second pair of differential amplified signals;

wherein amplifying the control voltages in a power amplifier stage comprises generating the first pair of differential amplified signals and the second pair of differential amplified signals in the power amplifier stage, the power amplifier stage further comprises a third transistor and a fourth transistor, the third transistor is of the first type, and the fourth transistor is of the second type, the first and third transistors are coupled as a differential pair between the first secondary side of the first transformer and the first primary side of the second transformer to generate the first pair of amplified signals, the second and fourth transistors are coupled as a differential pair between the second secondary side of the first transformer and the second primary side of the second transformer to generate the second pair of amplified signals.

6. The method of claim 5, wherein the first transistor and the third transistor are n-channel MOSFET (NMOSFET) transistors arranged in a common gate configuration and the second transistor and the fourth transistor are p-channel MOSFET (PMOSFET) transistors arranged in a common gate configuration.

7. A circuit comprising:

an input stage including an input transformer with a single primary side and two secondary sides, wherein the single primary side is configured to receive a control current, wherein the two secondary sides are configured to provide a plurality of control voltages as a function of the control current;

a power amplifier stage comprising a first transistor and a second transistor arranged in parallel, wherein the first transistor is a metal-oxide-semiconductor field-effect transistor (MOSFET) of a first type and the second transistor is a MOSFET of a second type that is different from the first type, wherein the first transistor and the second transistor are arranged in a push-pull configuration to generate a plurality of amplified signals; and an output stage including an output transformer with two primary sides and a single secondary side, wherein the two primary sides are configured to receive the plurality of amplified signals and the single secondary side is configured to provide an output voltage as a function of the plurality of amplified signals.

8. The circuit of claim 7, further comprising a driver stage to provide the control current to the input stage.

9. The circuit of claim 8, wherein the driver stage includes a transconductance circuit.

10. The circuit of claim 7, wherein the first transistor is an n-channel MOSFET (NMOSFET) transistor arranged in a common gate configuration and the second transistor is a p-channel MOSFET (PMOSFET) transistor arranged in a common gate configuration.

11. A circuit comprising:

an input stage configured to provide a plurality of control voltages based on a control current;

a power amplifier stage comprising a first transistor and a second transistor, the first transistor being a first type, the second transistor being a second type, the first and second transistors being arranged in a push-pull configuration to generate a plurality of amplified signals; and an output stage configured to combine the amplified signals and generate an output;

wherein the input stage comprises:

a first transformer including:

a primary side coupled to receive the control current, the control current being a differential control current, a first secondary side configured to generate a first differential control voltage based on the differential control current, and a second secondary side configured to generate a second differential control voltage based on the differential control current, wherein the output stage comprises:

a second transformer including:

a first primary side coupled to receive a first pair of the amplified signals, a second primary side coupled to receive a second pair of the amplified signals, and a secondary side configured to generate a differential output voltage based on the first pair of amplified signals and the second pair of amplified signals, wherein the power amplifier stage further comprises a third transistor and a fourth transistor, the third transistor is of the first type, the fourth transistor is of the second type, the first and third transistors are coupled as a differential pair between the first secondary side of the first transformer and the first primary side of the second transformer to generate the first pair of amplified signals, the second and fourth transistors are coupled as a differential pair between the second secondary side of the first transformer and the second primary side of the second transformer to generate the second pair of amplified signals.

12. The circuit of claim 11, wherein the first transistor and the third transistor are NMOS transistor arranged in a common gate configuration and the second transistor and the fourth transistor are PMOS transistors arranged in a common gate configuration.

* * * * *